(12) United States Patent  
Degner et al.

(10) Patent No.: US 9,013,869 B2
(45) Date of Patent: Apr. 21, 2015

(54) CONSOLIDATED THERMAL MODULE

(71) Applicant: Apple Inc., Cupertino, CA (US)

(72) Inventors: Brett W. Degner, Menlo Park, CA (US); Gregory Tice, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/145,584

(22) Filed: Dec. 31, 2013

(65) Prior Publication Data

US 2014/0211415 A1    Jul. 31, 2014

Related U.S. Application Data

(63) Continuation of application No. 13/223,224, filed on Aug. 31, 2011, now Pat. No. 8,619,420.

(60) Provisional application No. 61/503,512, filed on Jun. 30, 2011.

(51) Int. Cl.
*H05K 7/20* (2006.01)
*G06F 1/20* (2006.01)
*H01L 23/40* (2006.01)
*H05K 3/30* (2006.01)
*H05K 7/12* (2006.01)
*H01L 23/473* (2006.01)
*H01L 23/427* (2006.01)

(52) U.S. Cl.
CPC .............. *G06F 1/20* (2013.01); *H01L 23/4006* (2013.01); *H01L 23/473* (2013.01); *H05K 3/301* (2013.01); *H05K 7/20254* (2013.01); *H05K 2201/064* (2013.01); *H05K 2201/10265* (2013.01); *H05K 2201/10325* (2013.01); *H05K 2201/10393* (2013.01); *H05K 2201/10704* (2013.01); *H05K 2203/0278* (2013.01); *H01L 23/427* (2013.01); *H05K 7/12* (2013.01); *H05K 7/20* (2013.01); *H01L 2924/0002* (2013.01)

(58) Field of Classification Search
USPC .............. 361/679.46–679.54, 690–697, 688, 361/689, 702–712, 715–727, 732, 735, 361/740–748; 165/80.2–80.5, 104.21, 165/104.26, 104.33, 185; 257/706–727; 174/16.1, 16.3, 15.1, 252; 29/832, 834, 29/842, 592.1, 890.02, 890.03; 248/505, 248/510

See application file for complete search history.

(56) References Cited

U.S. PATENT DOCUMENTS

| | | | | |
|---|---|---|---|---|
| 6,042,388 | A * | 3/2000 | Tustaniwskyj et al. | 439/66 |
| 6,639,800 | B1 * | 10/2003 | Eyman et al. | 361/704 |
| 6,657,131 | B2 * | 12/2003 | Gonzalez et al. | 174/260 |
| 6,865,982 | B2 * | 3/2005 | Bunyard et al. | 92/120 |
| 6,885,557 | B2 * | 4/2005 | Unrein | 361/704 |
| 7,042,727 | B2 * | 5/2006 | Ulen et al. | 361/704 |
| 7,286,371 | B2 * | 10/2007 | Unrein | 361/810 |
| 7,518,872 | B2 * | 4/2009 | Tran et al. | 361/704 |
| 7,795,724 | B2 * | 9/2010 | Brodsky et al. | 257/712 |
| 7,830,665 | B2 * | 11/2010 | Lin | 361/700 |
| 8,520,393 | B2 * | 8/2013 | Homer et al. | 361/719 |
| 2003/0019097 | A1 * | 1/2003 | White | 29/832 |
| 2009/0004902 | A1 * | 1/2009 | Pandey et al. | 439/331 |

* cited by examiner

*Primary Examiner* — Michail V Datskovskiy
(74) *Attorney, Agent, or Firm* — Womble Carlyle Sandridge & Rice, LLP

(57) ABSTRACT

A low profile heat removal system suitable for removing excess heat generated by an integrated circuit operating in a compact computing environment is disclosed.

20 Claims, 5 Drawing Sheets

CONSOLIDATED THERMAL MODULE

CROSS-REFERENCE TO RELATED APPLICATIONS

This is a continuation of U.S. application Ser. No. 13/223,224 filed Aug. 31, 2011 entitled CONSOLIDATED THERMAL MODULE, now U.S. Pat. No. 8,619,420 issued Dec. 31, 2013, and claims priority to and the benefit under 35 U.S.C. §119(e) of U.S. Provisional Application Ser. No. 61/503,512, filed Jun. 30, 2011, entitled CONSOLIDATED THERMAL MODULE which are incorporated herein by reference.

FIELD

The present invention relates generally to the cooling of computer components. More particularly an apparatus is described for reducing the size, weight, footprint, and cost of a thermal module.

BACKGROUND

Computer cooling keeps components within safe operating limits by removing waste heat. In some cases the Central Processing Unit (CPU) alone needs over 100 W of power, which must then be dissipated. Most computers remove the waste heat by using at least one of the following thermal modules: heat sinks, fans, water cooling, heat pipes, or phase change cooling. Conventional desktop computer designs have a relatively enough space for a large heat sink, and fan for regulating the operating temperature of an Integrated Circuit (IC). These conventional designs also include an independent loading mechanism (ILM), which when fastened secures the IC into an IC socket. Unfortunately, the ILM only comes into contact with the IC at 2 discrete points, resulting in uneven loading on the IC. The combination of both the thermal module and the ILM also requires multiple attachment positions on the printed circuit board (PCB) it is attached to. The attachment positions for the ILM fall outside of the footprint of the IC as they typically screw into a steel backer plate located below the PCB. The attachment positions for the thermal module fall even farther from the IC since they must fall outside of the footprint of the ILM. Unfortunately, because the screw attachments are located significantly outside the footprint of the IC they put a significant amount of torque on the PCB. Unopposed torque on the PCB below the IC could result in bending or crowning of the PCB, and could also prevent IC pins from seating properly. This means it is crucial for the backer plate to be strong enough to oppose the torque created at the attachment points. In addition to being rather tall, this attachment configuration also takes up a lot of board space on the PCB.

Small form factor computers typically use the same processors as their larger desktop counterparts. Unfortunately, as discussed above, all the components that are required to cool a desktop class CPU take up a significant amount of room. Space or volume is at a premium in small form factor computer environments and it is essential that any heat removal system must be able to maximize heat transfer while minimizing the space occupied Therefore a way to reduce the space taken up by the CPU cooling components in a small form factor computer is desired.

SUMMARY

This paper describes many embodiments that relate to a method and apparatus for the manufacture and implementation of a consolidated thermal module.

A low Z profile consolidated thermal module (CTM) is disclosed. The CTM is designed to both secure and cool an integrated circuit (IC) mounted to a printed circuit board (PCB). The CTM includes a number of components including: a heat removal assembly having a reduced footprint, a retaining mechanism, a backer plate and at least one fastener. The heat removal assembly is disposed on a first surface of the PCB, and in thermal contact with the integrated circuit. The retaining mechanism is disposed on a second surface of the PCB. The backer plate is disposed between the retaining mechanism and the PCB. At least one fastener is used to secure the heat removal assembly to the retaining mechanism, where the retaining mechanism causes a substantially uniform retaining force to be applied across the backer plate thereby minimizing an amount of torque applied to the IC.

In another embodiment a method for installing a consolidated thermal module (CTM) in a small form factor computer is described. The method can be carried out by performing at least the following operations: receiving a number of CTM components including at least a backer plate, a retaining mechanism, and a heat removal assembly; receiving a printed circuit board (PCB) for a small form factor computer; placing the backer plate on a first side of the PCB; placing the retaining mechanism beneath the backer plate; placing the heat removal assembly on a second side of the PCB, in thermal contact with the IC; and securing the retaining mechanism to the heat removal assembly.

In yet another embodiment, an apparatus for installing a consolidated thermal module in a computing device during an assembly operation is disclosed. The apparatus includes at least means for receiving a plurality of CTM components including at least a backer plate, a retaining mechanism, and a heat removal assembly, means for receiving a printed circuit board (PCB) for a small form factor computer, means for placing the backer plate on a first side of the PCB, means for placing the retaining mechanism beneath the backer plate, means for placing the heat removal assembly on a second side of the PCB, in thermal contact with the IC, and means for securing the retaining mechanism to the heat removal assembly.

BRIEF DESCRIPTION OF THE DRAWINGS

The invention and the advantages thereof may best be understood by reference to the following description taken in conjunction with the accompanying drawings.

DETAILED DESCRIPTION

Figure 1A:
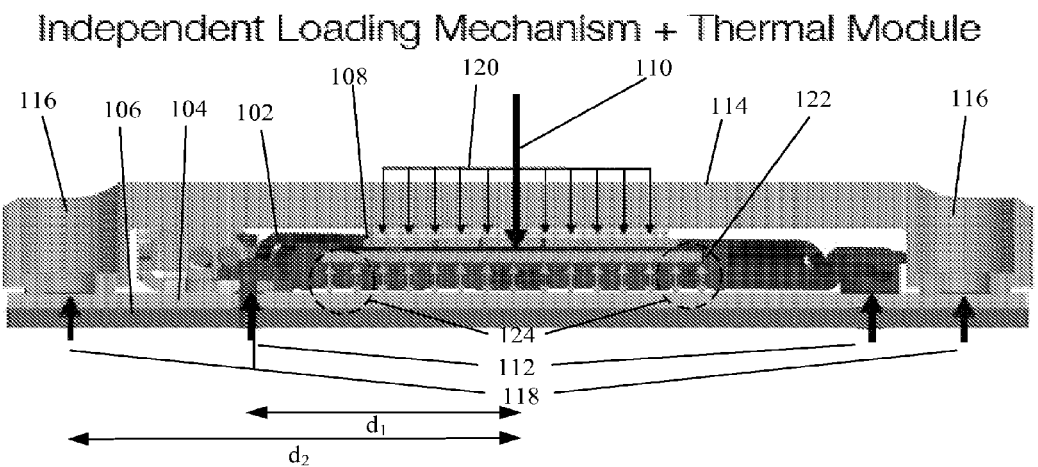
FIG. 1A shows a cross-section of the conventional design.

The present invention relates generally to the cooling of computer components. More particularly an apparatus is described for reducing the size, weight, footprint and cost of a thermal module.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

Computer cooling is used to keep components within safe operating limits by removing waste heat. In some cases a Central Processing Unit (CPU) alone needs over 100 W of power, which must then be dissipated. Cooling methods generally include at least one of a number of available thermal modules including: heat sinks; fans; water cooling; heat pipes; or phase change cooling. Conventional desktop computer designs have plenty of space for a large heat sink, and fan for regulating the operating temperature of an Integrated Circuit (IC). These conventional designs also include an independent loading mechanism (ILM), which when fastened secures the IC into an IC socket with about 100 pounds of force. The ILM is useful in a desktop computer as it allows the IC to be relatively easily removed by an end user. Unfortunately, in order to leave room for contact between the discrete thermal module and the IC, the ILM concentrates about 100 pounds of force on the IC in 2 small contact positions, resulting in uneven loading on the IC. The combination of both the thermal module and the ILM also requires multiple attachment positions on the printed circuit board (PCB). The attachment positions for the ILM fall outside of the footprint of the IC as they simply screw into a backer plate located below the PCB. The attachment positions for the thermal module fall even farther from the IC since it has to fit around the ILM. Unfortunately, because the fasteners are located significantly outside the footprint of the IC they put a significant amount of torque on the PCB. This means that even a steel backer plate must be rather thick, since it must be strong enough to oppose the large torque moment created by the force applied at the attachment points. This attachment configuration also takes up a lot of space on the PCB, and prevents supporting components from being place close to the CPU.

Small form factor computers use desktop class ICs in enclosures much smaller than the desktop cases they were designed for. In many designs the enclosure is not only smaller but is also integrated into a display unit. The reduction in enclosure size, and proximity to the heat producing display unit, make thermal management much more challenging than in conventional desktop computers. Not only is there more heat in a more limited space but desktop class ICs must typically be maintained at significantly lower temperatures than their mobile counterparts. Because, thermal management is so challenging in the design of small form factor computers, heat pipes are used to help efficiently remove waste heat from ICs. A heat pipe is a heat transfer mechanism that can transport large quantities of heat with a very small difference in temperature between the hotter and colder interfaces and is therefore well suited for compact computing environments. A typical heat pipe consists of a sealed pipe or tube made of a material with high thermal conductivity such as copper or aluminum. The heat pipe includes a working fluid, (or coolant), chosen to match the operating temperature of the compact computing device. Some example fluids are water, ethanol, acetone, sodium, or mercury. (Clearly, due to the benign nature and excellent thermal characteristics, water is used as the working fluid in consumer products such as laptop computers.) Inside the heat pipe's walls, an optional wick structure exerts a capillary pressure on the liquid phase of the working fluid. The wick structure is typically a sintered metal powder or a series of grooves parallel to the heat pipe axis, but it may be any material capable of exerting capillary pressure on the condensed liquid to wick it back to the heated end. It should be noted, however, that the heat pipe may not need a wick structure if gravity or some other source of acceleration is sufficient to overcome surface tension and cause the condensed liquid to flow back to the heated end.

Space or volume is at a premium in compact computer environments and it is essential that any heat removal system must be able to maximize heat transfer while minimizing the space occupied. One way to further maximize space inside the small form factor computer would be to reduce the size of the cooling unit, while maintaining the amount of heat removed. Unfortunately, there has not been much effort made towards reducing the size of the cooling unit, since in most desktop applications the current overall size is not a problem. A design which consolidates the ILM and thermal module of the conventional unit solves the following problems: (1) it can allow an overall size and weight reduction of up to 50%; (2) it can significantly lower the overall production costs; and (3) it can increase the reliability of the system by placing more uniform loads on the IC and PCB.

FIG. 1A show a cross-section of the conventional thermal cooling system that includes at least ILM 102. ILM 102 is attached to PCB 104 by a number of fasteners such as screws which are anchored through PCB 104 and backer plate 106. As can be seen, backer plate 106 has a substantially greater footprint than does IC 108. It should be further noted that the overall footprint of ILM 102 and backer plate 106 takes up substantial amounts of PCB real estate and reduces the flexibility of circuit traces formed on the PCB. Note how force 110 imparted by ILM 102 is imparted in the middle of integrated circuit (IC) 108 at about midpoint of IC 108, and at ILM attachment positions 112 that is outside the footprint of IC 108; these forces can result in a significant amount of torque on PCB 104. Discrete thermal module 114 is also connected to PCB 104 and backer plate 106. Discrete thermal module 114 typically includes springs inside of the spring receiver channels 116 used to impart a precise amount of force at thermal module attachment points 118. The attachment of discrete thermal module 114 puts additional torque on PCB 104 at thermal module attachment points 118 because the position of thermal module attachment points 118 at distance d2 from the center of IC 108 creates a large moment arm that is only opposed directly over IC 108 by distribution of force 120. Distances d1 and d2 clearly show the length of the moment arms created by the force at ILM positions 112, and thermal module attachment points 118. All this torque on PCB 104 is especially problematic as IC 108 is electrically attached to socket 122 with a number of signal pins 124. In many cases IC 108 can have over a thousand signal pins 124. If PCB 104 is bent or deformed by the applied moments the deformation can cause undesirable forces to be exerted on signal pins 124 which can dislodge or interrupt the signal they carry. In another more extreme case PCB 104 itself could crack from the applied moments. Thus the selection of a thick backer plate 106 is clearly critical for the conventional configuration.

Figure 1B:
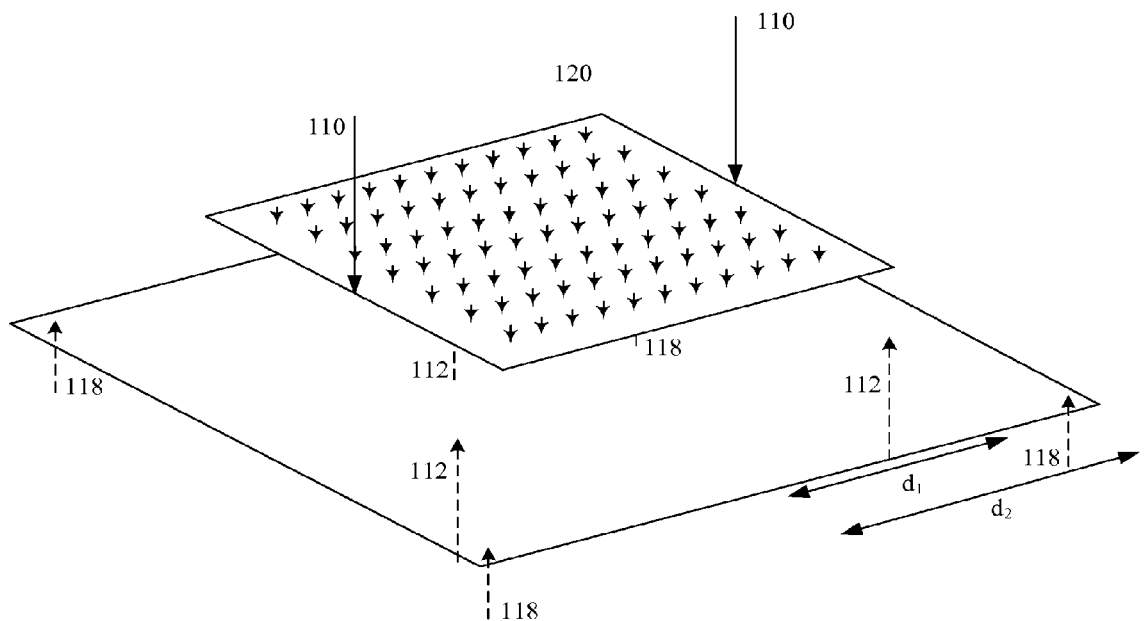
FIG. 1B shows a perspective view of the forces exerted by the conventional design.

FIG. 1B shows a perspective view of the forces being exerted by the conventional design. In FIG. 1B a top layer represents the top side of IC 108 and a bottom layer represents the bottom side of backer plate 106. In FIG. 1B the large discrete loading of the ILM can be seen in conjunction with distribution of force 120 imparted by the discrete thermal module. In the bottom layer of FIG. 1B note particularly how much bigger the area of the PCB being acted upon is than the area occupied by CPU 108 itself. Also note that the PCB is being acted on at 7 discrete points; 3 from the ILM and 4 more from the discrete thermal module.

Figure 2A:
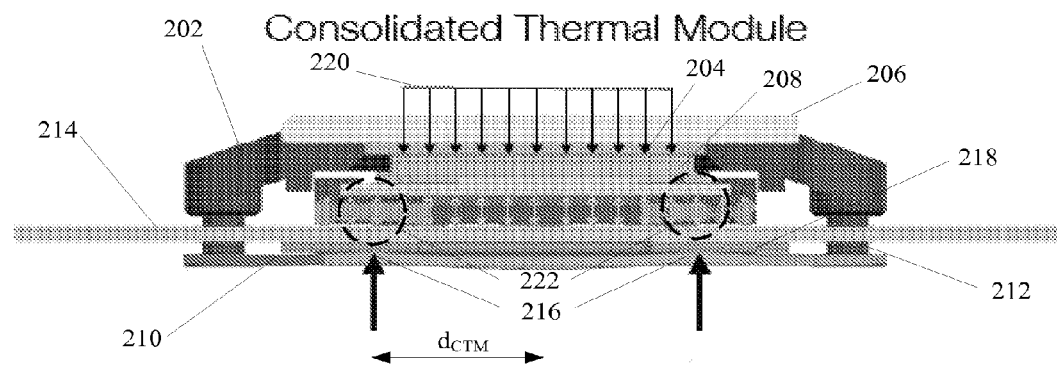
FIG. 2A shows a cross-section of the consolidated thermal module m accordance with the described embodiments.

FIG. 2A shows a cross-section of the consolidated thermal module (CTM) in accordance with the described embodiments. Thermally conductive casting 202 of the CTM can be made from many possible materials such as cast aluminum. Thermally conductive slug 204 and heat pipe 206 are both attached to thermally conductive casting 202. Thermally conductive slug 204 can be made of thermally conductive material along the lines of copper and can be in direct contact with the top side of IC 208. Slug 204 conducts heat from IC 208 to heat pipe 206. Heat pipe 206 can be arranged to overlay the entire area of thermally conductive slug 204 that is in contact with IC 208. This allows for an efficient conduction of heat from IC 208 to heat pipe 206. Since a retaining mechanism, embodied here by leaf spring 210, provides the requisite tension there is no need for springs like those used to set tension at the conventional design's thermal module attachment points 118. In this way, fastener attachment points 212, which connect leaf spring 210 and thermally conductive casting 202 through PCB 214, can have a much lower Z profile than the spring receiver channels 116 required in the conventional design. As shown more clearly below in FIG. 3B, leaf spring 210 can be designed to exert an evenly distributed, predetermined leaf spring force 216 across backer plate 218. In response to leaf spring 210 exerting leaf spring forces 216, thermally conductive slug 204 can respond by exerting distributed CTM force 220 to IC 208. Since components of leaf spring force 216 are exerted directly onto IC 208, the distances d1 and d2 from the conventional design are significantly reduced to a single, much shorter distance $d_{CTM}$. The application of leaf spring force 216 at distance $d_{CTM}$ advantageously positions leaf spring force 216 directly beneath a number of signal pins 222. Because leaf spring force 216 is exerted directly below signal pins 222, the likelihood of dislodging or disrupting the connections is much reduced.

Figure 2B:
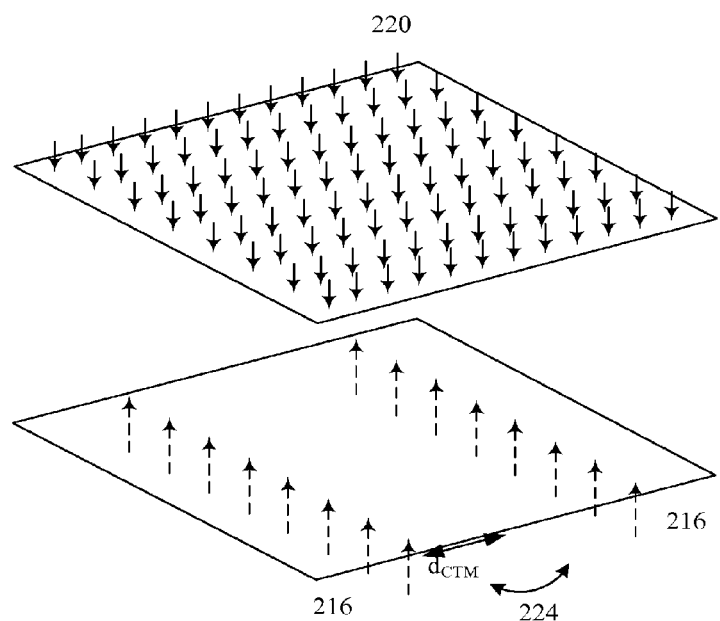
FIG. 2B shows a perspective view of the forces exerted by the consolidated thermal module design, in accordance with the described embodiments.

FIG. 2B more clearly shows force distribution 216 across the bottom of backer plate 218 from a perspective view. In FIG. 2B a top layer represents the top side of IC 208 and a bottom layer represents the bottom side of backer plate 218. The bottom layer of FIG. 2B shows how much the introduction of the leaf spring helps to even out the load across the bottom of the backer plate. Instead of having point forces like the conventional design, leaf spring 210 (not shown) spreads the force out over two lines of force. The two rows of exerted leaf spring force 216 are within the confines of IC 208 (not shown). Therefore, the use of leaf spring 210 (not shown) enhances the flexibility in determining the force pattern, and although the described embodiment shows two lines of force under the chip, many other force configurations might be desirable when applied to different computing environments and should be considered a part of this disclosure. Another advantage of having two solid lines of force is that the torque is limited to single torque axis 224. This could allow further refinement and size reduction of backer plate 218 since backer plate 218 can be specifically designed to counter torque in that specific axis.

Figure 3A:
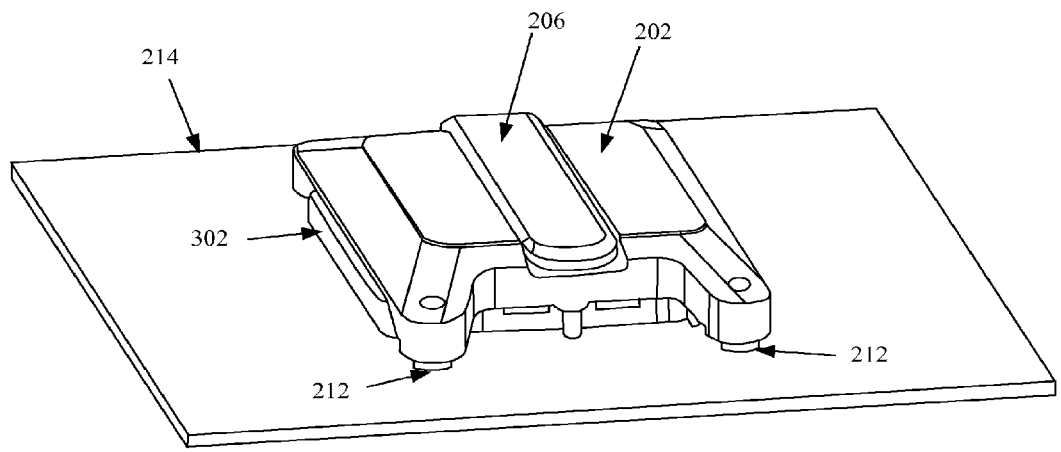
FIGS. 3A and 3B show perspective views of both the top and bottom of the consolidated thermal module.
Figure 3B:
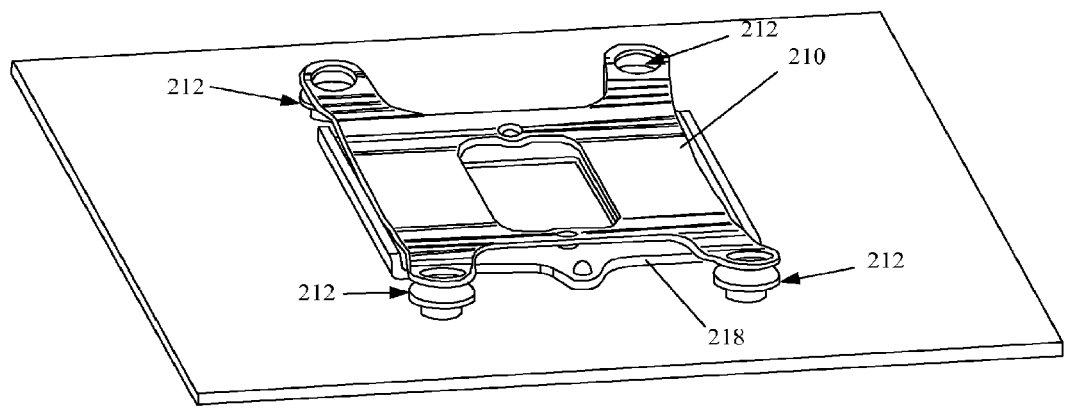

FIGS. 3A and 3B show perspective views of both the top and bottom of the CTM. In FIG. 3A heat pipe 206 can be seen running along a channel in thermally conductive casting 202. In one embodiment the other end of heat pipe 206 could run over to a heat exchanger. Also visible in FIG. 3A are fastener attachment points 212. Fastener attachment points 212 each pass through a hole in PCB 214. It should be noted that fastener attachment points 212 only attach thermally conductive casting 202 and leaf spring 210; they do not exert any force on PCB 214. Socket 302 for IC 208 is visible beneath thermally conductive casting 202. Socket 302 has channels for securing signal pins 222 of IC 208. In FIG. 3B the relative size and thickness of leaf spring 210 and backer plate 218 can be seen. Notice that in this embodiment backer plate 218 is positioned primarily underneath socket 302. Fastener attachment points 212 are also visible, although in this diagram they are shown in an unfastened position. This helps to demonstrate that leaf spring 210 must bend to attach to fastener attachment points 212. The bending of the leaf spring at each of the four fastener attachment points 212 is what actually creates leaf spring force 216.

Figure 4A:
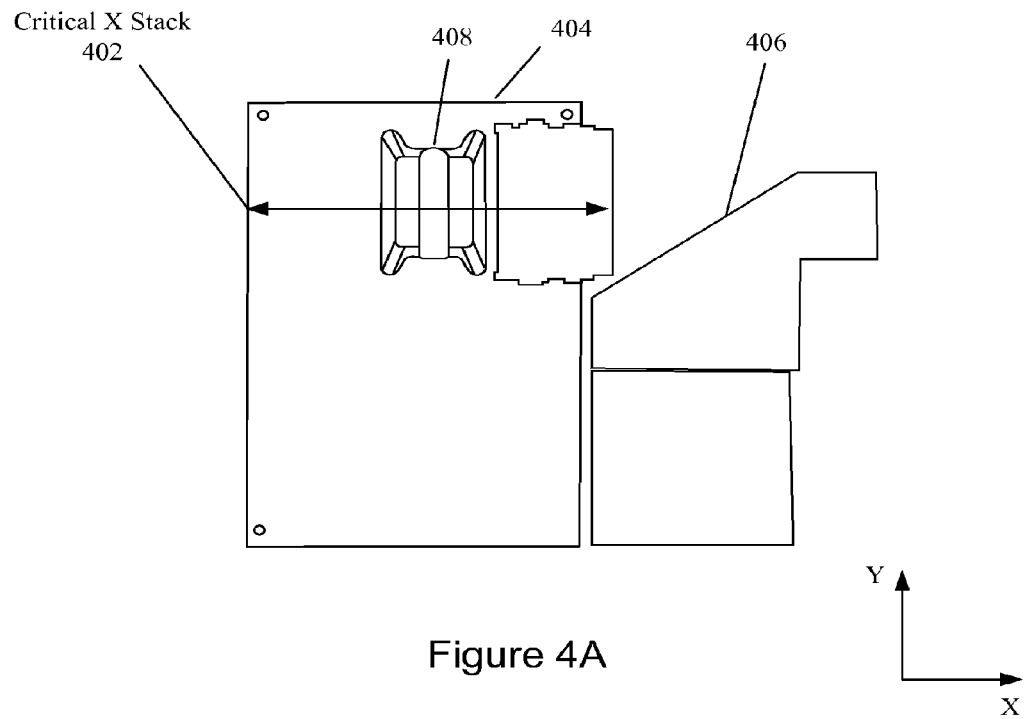
FIGS. 4A and 4B show two examples of design limitations for small form factor computer enclosures.
Figure 4B:
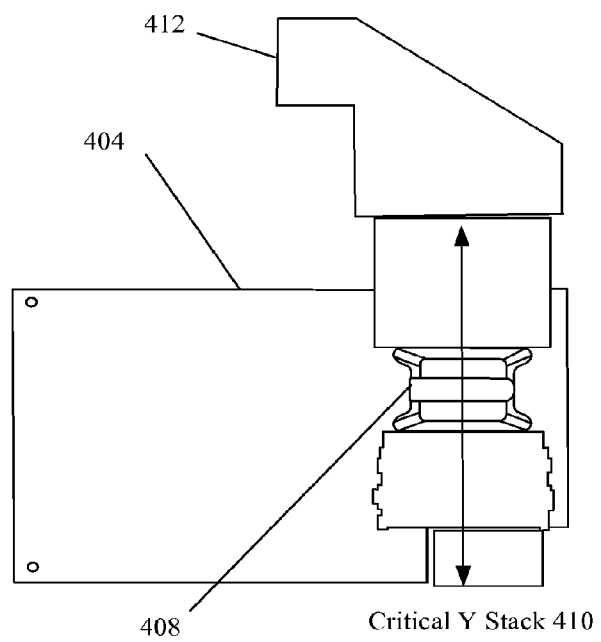

FIGS. 4A and 4B show two examples of design limitations for small form factor computer enclosures such as the iMac® manufactured by Apple Inc. of Cupertino, Calif. Layouts for components inside of two different small form factor computer enclosures are shown. In each enclosure there is a critical stack height that cannot be exceeded. A critical stack might include components such as integrated circuits, memory modules, and heat exchangers. In FIG. 4A exceeding the critical X stack height 402 would result in having to extend the length of PCB 404, to conform closely to the outline of component 406. As can be seen in FIG. 4A the size of CTM 408 directly affects the stack height. In addition to having to pay for a larger PCB 404, the bottom portion of the board would have to be shaved off to get it to fit inside the enclosure, thus creating an extra manufacturing step and wasting materials. In FIG. 4B, critical Y stack height 410 must be achieved in order to properly position component 412 in the enclosure. In both examples by reducing the size of CTM 408, the critical X or critical Y stack heights can be achieved.

In summary, a design which consolidates the ILM and thermal module of the conventional unit solves many problems. As shown in FIGS. 4A and 4B, reducing the size of the CTM achieves important objectives. Specifically the significantly reduced footprint taken up on the board (compare FIGS. 1A and 2A) allows for the critical stack heights to be achieved. A smaller footprint also allows more flexibility in placing the CTM on the PCB since it becomes easier to fit the CTM between other important components. The shortened distance between the edge of the IC and the end of the CTM makes it possible to position IC power supplies closer to the IC. The reduction in the number of attachment screws creates fewer holes in the PCB, allowing for more flexibility in routing electrical traces. Additionally, the reduced height of the CTM itself allows a thinner enclosure size in the Z direction. Finally, production costs are reduced for the following reasons: the backer plate can require less material; the cost of producing the ILM is recovered; the attachment process involves fewer fasteners; and the aluminum casting can be smaller.

Figure 5:
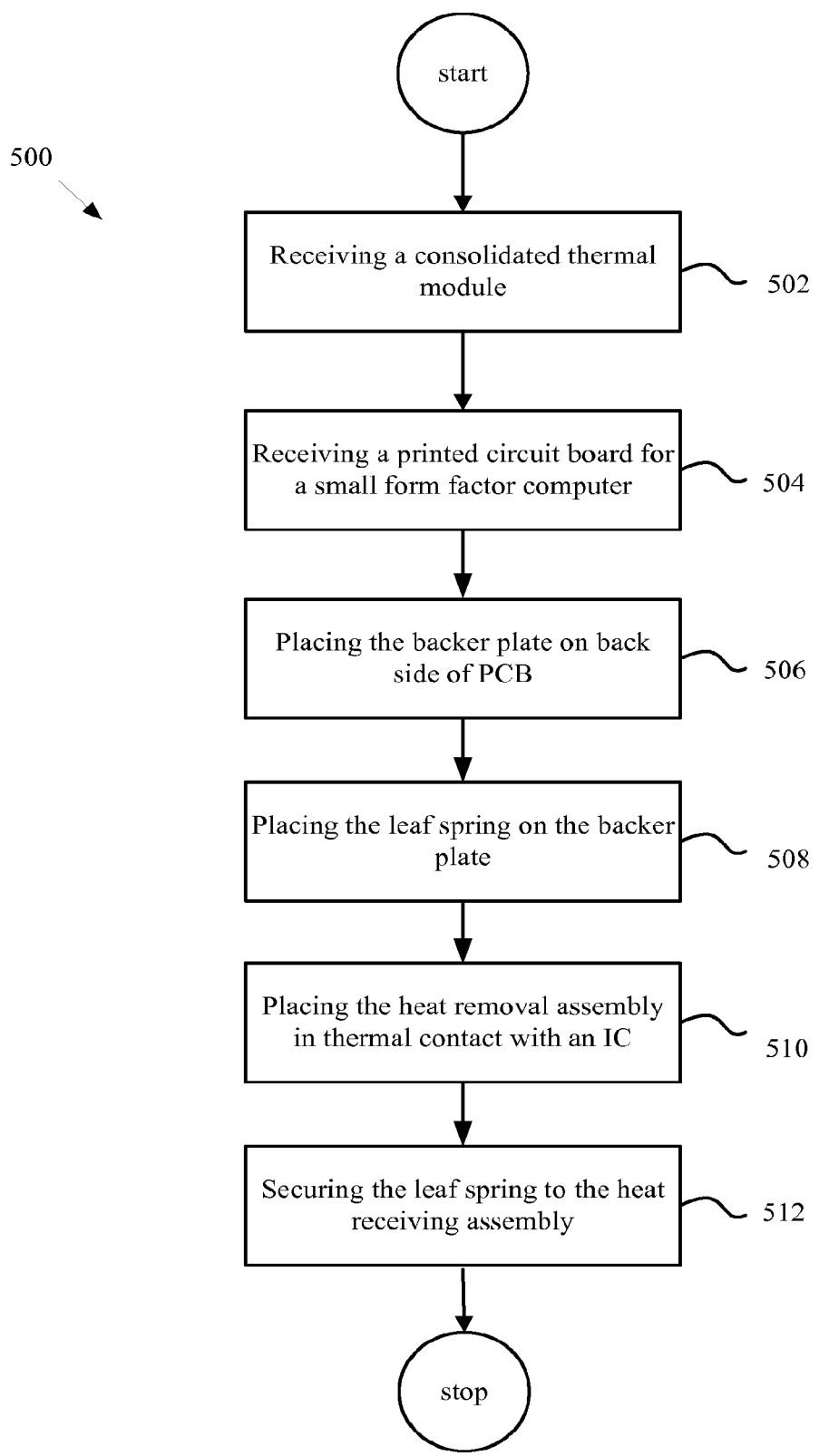
FIG. 5 shows a flowchart detailing a manufacturing process 500 for installing a consolidated thermal module into a small form factor computer.

FIG. 5 shows a flowchart detailing a manufacturing process 500 for installing a CTM. Process 500 begins at step 502 by receiving a CTM. In step 504 a PCB for a small form factor computer is received. In step 506 the backer plate is placed on the back side of the PCB. In step 508 the leaf spring is placed on the backer plate. In step 510 the heat removal assembly is placed on the front side of the PCB. In step 512 the leaf spring is secured to the heat removal assembly.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A consolidated thermal module (CTM) used to secure an integrated circuit (IC) to a socket disposed on a first surface of a printed circuit board (PCB) and to maintain the IC in thermal contact with a heat removal assembly comprising:
a stiffener plate disposed on a second surface of the PCB;
a retaining mechanism disposed on the stiffener plate; and
at least one fastener used to secure the heat removal assembly to the stiffener plate and the retaining mechanism, wherein the retaining mechanism evenly distributes a retaining force across the stiffener plate that maintains the IC in uniform electrical contact with electrical contacts within the socket and maintains the IC in thermal contact with the heat removal assembly.

2. The CTM as recited in claim 1, further comprising a socket between the heat removal assembly and retaining mechanism.

3. The CTM as recited in claim 2, wherein the socket engages the IC and the PCB.

4. The CTM as recited in claim 1, wherein the heat removal assembly comprises a heat transfer conduit capable of transporting heat from the IC.

5. The CTM as recited in claim 1, further comprising a thermally conductive casting engaged with the PCB and the heat removal assembly.

6. The CTM as recited in claim 5, wherein the retaining mechanism includes a plurality of fastener attachments points, and wherein the plurality of fastener attachment points attach to the thermally conductive casting through the PCB.

7. The CTM as recited in claim 6, wherein the plurality of fastener attachment points includes a first fastener attachment point, the first fastener attachment point positioned on a first extension of the retaining mechanism, the first extension capable of bending with respect to the retaining mechanism.

8. The CTM as recited in claim 7, wherein the IC is positioned proximate to a first surface of the PCB and the retaining mechanism is positioned proximate to a second surface of the PCB, the second surface opposite the first surface.

9. The CTM as recited in claim 1, wherein the retaining mechanism bends in at least four separate portions.

10. A computing device, comprising:
a heat transfer assembly having a thermal transport positioned on a first portion of a printed circuit board, the thermal transport engaged with an integrated circuit;
a spring element positioned on a second portion of the printed circuit board opposite the first portion, the spring element having a first attachment point, wherein the spring element bends at the first attachment point to exert a force on a plate such that the plate is maintained in contact with the printed circuit board;
wherein the force from the spring element maintains the integrated circuit in thermal contact with the heat transfer assembly; and
wherein the force from the thermal transport maintains the integrated circuit seated in electrical contact with the printed circuit board.

11. The computing device as recited in claim 10, wherein the force from the spring element maintains the integrated circuit in electrical contact with the printed circuit board.

12. The computing device as recited in claim 11, wherein the plate provides a uniform force on the printed circuit board.

13. The computing device as recited in 10, wherein the spring element includes a plurality of extensions and a plurality of fastener attachment points.

14. The computing device as recited in 13, wherein the plurality of extensions bend with respect to a central portion of the spring element.

15. The computing device as recited in claim 13, wherein the plurality of fastener attachment points engage the thermal transport.

16. A consolidated thermal module (CTM) for securing and cooling an integrated circuit (IC) mounted to a printed circuit board (PCB), comprising:
a heat removal assembly disposed on a first surface of the PCB and in thermal contact with the IC, comprising:
a thermally conductive casting; and
a heat transfer conduit capable of transporting heat from the IC;
a plate disposed on a second surface of the PCB, the second surface opposite the first surface; and
a retaining mechanism disposed on a portion of the plate, wherein the retaining mechanism secures the thermally conductive casting and the plate to the PCB by evenly distributing a retaining force across the plate, the retaining force capable of maintaining the IC in thermal contact with the heat transfer conduit.

17. The CTM as recited in claim 16, wherein the thermally conductive casting provides a force capable of maintaining the IC in electrical contact with the PCB.

18. The CTM as recited in claim 16, wherein the retaining mechanism is a spring.

19. The CTM as recited in claim 18, wherein the spring comprises a first portion and a second portion, the first portion bending to form a first non-linear portion of the spring, the second portion bending to create a second non-linear portion of the spring element.

20. The CTM as recited in claim 16, wherein the plate provides a uniform force on the printed circuit board.

* * * * *